United States Patent
Orejas et al.

(10) Patent No.: US 9,001,868 B2
(45) Date of Patent: Apr. 7, 2015

(54) SYSTEMS AND METHODS FOR ENHANCING GNSS NUMERICALLY CONTROLLED OSCILLATORS

(71) Applicant: Honeywell International Inc., Morristown, NJ (US)

(72) Inventors: Martin Orejas, Brno (CZ); Ondrej Kutik, Brno (CZ)

(73) Assignee: Honeywell International Inc., Morristown, NJ (US)

(*) Notice: Subject to any disclaimer, the term of this patent is extended or adjusted under 35 U.S.C. 154(b) by 116 days.

(21) Appl. No.: 13/873,536

(22) Filed: Apr. 30, 2013

(65) Prior Publication Data

US 2014/0321513 A1 Oct. 30, 2014

(51) Int. Cl.
*H04B 1/00* (2006.01)
*H04B 1/7087* (2011.01)
*H03J 1/00* (2006.01)

(52) U.S. Cl.
CPC .......... *H04B 1/7087* (2013.01); *H03J 1/0008* (2013.01)

(58) Field of Classification Search
USPC ......... 375/354, 362, 316, 295, 259, 130, 140, 375/147, 149; 455/3.02, 208
See application file for complete search history.

(56) References Cited

U.S. PATENT DOCUMENTS

| 7,315,215 | B2 | 1/2008 | Cafaro et al. | |
|---|---|---|---|---|
| 7,830,951 | B2 | 11/2010 | Jia | |
| 8,018,379 | B1 | 9/2011 | Sun et al. | |
| 2005/0175075 | A1* | 8/2005 | Martin et al. | 375/149 |
| 2006/0104394 | A1 | 5/2006 | Chan et al. | |
| 2010/0159862 | A1 | 6/2010 | Reial et al. | |
| 2011/0231693 | A1* | 9/2011 | Mori | 713/500 |

FOREIGN PATENT DOCUMENTS

WO 03069865 8/2003

OTHER PUBLICATIONS

Pany et al., "Coherent integration Time: The Longer, the Better", Nov. 2009, pp. 52-61, Publisher: www.insidegnss.com.
European Patent Office, "European Search Report from EP Application No. 14164819.6 mailed Sep. 3, 2014", "from Foreign Counterpart of U.S. Appl. No. 13/873,536", Sep. 3, 2014, pp. 1-3, Published in: EP.

* cited by examiner

*Primary Examiner* — Vineeta Panwalkar
(74) *Attorney, Agent, or Firm* — Fogg & Powers LLC

(57) ABSTRACT

Systems and methods for enhancing numerically controlled oscillators are provided. In certain embodiments, a numerically controlled oscillator enhancer includes a desired rate interface configured to receive a desired numerically controlled oscillator rate from an external device and a closest quantized rate identifier configured to identify a closest quantization rate that is closest to the desired numerically controlled oscillator rate. Further, the numerically controlled oscillator enhancer includes a quantization rate corrector configured to identify the quantization rate correction that, when applied to the closest quantization rate, constrains an accumulated quantization error within an error range and a rate output configured to output a corrected quantized numerically controlled oscillator rate.

20 Claims, 4 Drawing Sheets

SYSTEMS AND METHODS FOR ENHANCING GNSS NUMERICALLY CONTROLLED OSCILLATORS

BACKGROUND

When Global Navigation Satellite Systems (GNSS) receivers receive signals from satellites, the receivers process the satellite signal by down-converting the signal to the baseband and also despreading the signal. In certain implementations, to down convert and despread the signal, a GNSS receiver uses numerically controlled oscillators (NCO). For example, the GNSS receiver has a carrier NCO that provides an oscillatory signal that is used to down convert a signal from an intermediate frequency (IF) to a baseband frequency. Also, the GNSS receiver has a code NCO that is used to remove a code (like a pseudorandom noise code) from the baseband signal.

To set the frequency of the oscillatory signal for both the carrier and code NCOs, digital control signals are provided that indicate the frequency that should be used to down-convert the IF signal to baseband and remove the code. A control signal is represented by an integer step size, which is periodically added to an internal NCO counter. A NCO rate is determined by impulses generated when the internal NCO counter overflows. However, because the NCO and its control signal are digital, the accuracy and precision of the NCOs are limited by the number of bits allocated to the NCO's internal counter. The higher the number of allocated bits, the finer the resolution of the generated impulses period. Thus, the desired NCO rate is represented by a quantized representation of different frequency levels. Due to the quantized frequency rates, the NCO is not always able to accurately provide oscillating signals at the IF or the code frequency. When an NCO is unable to accurately represent the IF or the code frequency, a quantization error that affects the accuracy of the GNSS receiver accumulates over an update period for the NCO.

SUMMARY

Systems and methods for enhancing numerically controlled oscillators are provided. In certain embodiments, a numerically controlled oscillator enhancer includes a desired rate interface configured to receive a desired numerically controlled oscillator rate from an external device and a closest quantized rate identifier configured to identify a closest quantization rate that is closest to the desired numerically controlled oscillator rate. Further, the numerically controlled oscillator enhancer includes a quantization rate corrector configured to identify the quantization rate correction that, when applied to the closest quantization rate, constrains an accumulated quantization error within an error range and a rate output configured to output a corrected quantized numerically controlled oscillator rate.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
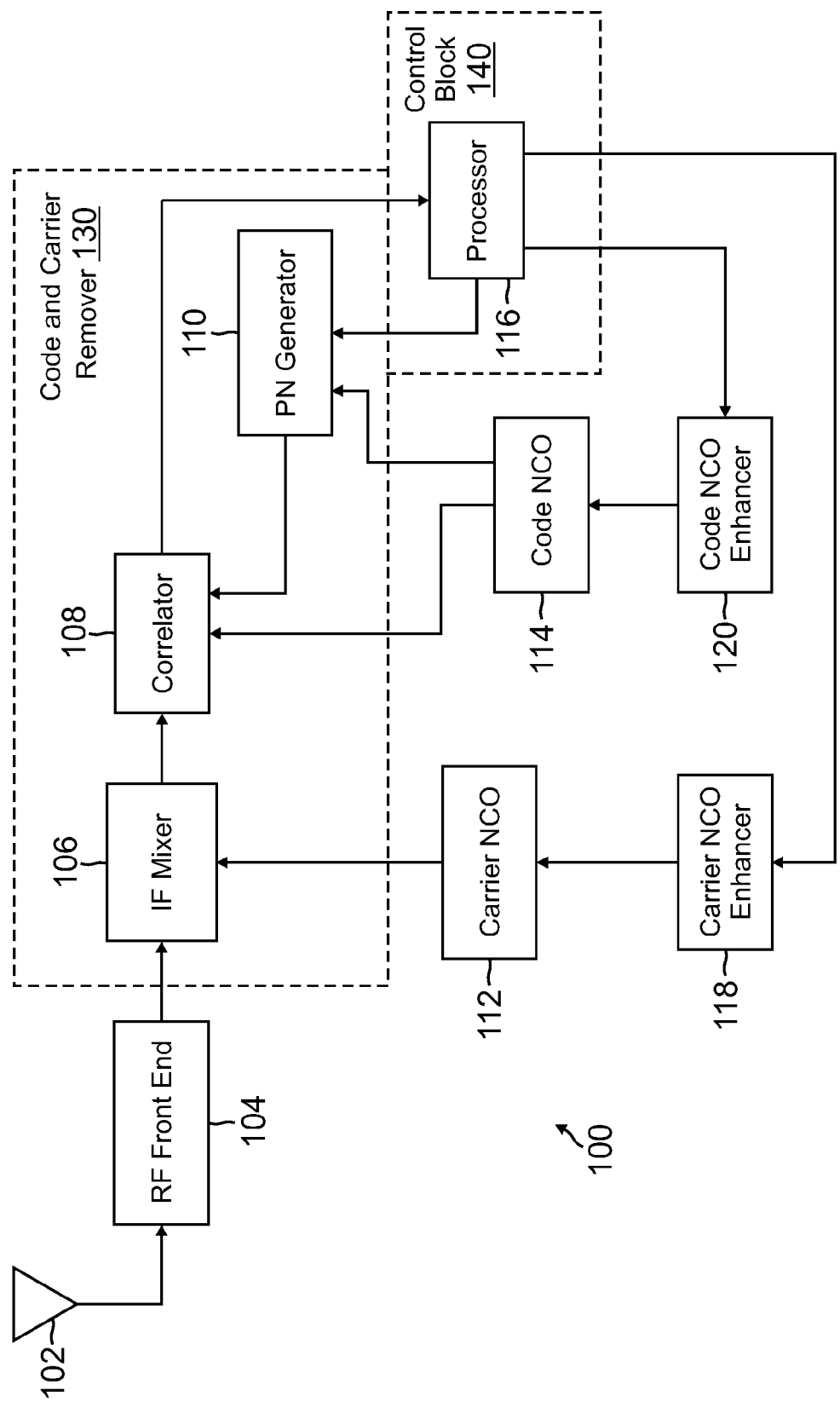
FIG. 1 is a block diagram of a GNSS receiver in one embodiment described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments for enhancing GNSS numerically controlled oscillators (NCOs) are described herein. To correct the quantization errors that accumulate due to differences between the frequencies of a received GNSS signal and the quantized frequencies provided by the NCOs, a GNSS receiver includes at least one NCO enhancer. The NCO enhancer corrects the quantization errors by monitoring the accumulated quantization error and when the NCO receives an update from a controlling processor, the NCO uses the desired NCO frequency and the accumulated quantization error to select a quantized frequency that constrains the magnitude of the accumulated quantization error to a limited range.

FIG. 1 is a block diagram of a GNSS receiving system 100 that includes both a code NCO enhancer 120 and a carrier NCO enhancer 118. GNSS receiving system 100 receives satellite signals from satellites that orbit the earth. For example, the GNSS receiving system 100 receives signals from satellites that are part of the NAVSTAR GPS, GLONASS, GALILEO, and the like. GNSS receiving system 100 is able to determine its position in relation to the Earth by communicating with the satellites. In certain implementations, the GNSS receiving system 100 is a direct sequence spread spectrum (DSSS) signal receiver. Before transmitting a signal to be received by the GNSS receiving system 100, a satellite uses a pseudorandom noise sequence to phase modulate a carrier signal that has been modulated with a data signal. The data signal includes an accurate time that was provided by at least one atomic clock. The data signal may also describe clock behavior, status messages, and correction data that corrects ionospheric delay, time offsets, and the like. In certain implementations the GNSS receiving system 100 can utilize previously decoded and stored almanac data to speed up the signal acquisition process.

To process the signal from a GNSS satellite, the GNSS receiving system 100 includes an antenna 102 that receives signals transmitted from GNSS satellites. The antenna 102 provides a signal to an RF front end 104. The RF front end 104 receives the signal and outputs an intermediate frequency signal. To provide the intermediate frequency signal, the RF front end 104 includes amplifiers, mixers, analog to digital converters, and other electronics that may be useful in receiving a signal from a satellite and down converting the signal to an intermediate frequency. When the signal is down converted from a radio frequency to an intermediate frequency, the RF front end 104 passes the intermediate frequency signal to code and carrier remover 130. The code and carrier remover 130 mixes the intermediate frequency signal to a baseband signal and despreads the incoming signal by removing a code from the incoming signal.

In certain implementations, to process the intermediate frequency signal, the code and carrier remover 130 on the GNSS receiving system 100 mixes the intermediate frequency signal to form a baseband signal at an IF mixer 106. For example, to downconvert the intermediate frequency signal to a baseband signal, the intermediate frequency signal is mixed with an oscillating signal produced by an NCO, such as carrier NCO 112. The carrier NCO 112 provides the oscillating signal at a particular frequency at or near the frequency that is the difference between the intermediate frequency and the baseband frequency. In certain implementations, when the intermediate frequency signal is mixed down to a baseband signal, the baseband signal is then passed through a correlator 108 in the code and carrier remover 130. Alternatively, the intermediate frequency signal is passed through the correlator 108 before being mixed down to the baseband frequency.

In certain embodiments, the correlator 108 correlates the incoming signal with a locally generated pseudorandom noise (PN) sequence generated by a PN generator 110. The PN generator 110 is driven by a code NCO 114. The local PN generator 110 produces a PN sequence having a signal frequency equal to the code rate of the incoming signal. Further, the correlator 108 despreads the incoming signal to the original data bandwidth by correlating the incoming signal with a locally generated PN-sequence identical to and in synchronization with the PN-sequence used to spread the carrier at the radio transmitter, such as the GNSS satellite. The hardware section associated with the amplification, down-conversion, and analog-to-digital conversion is called the RF front end 104. The other section, which processes the RF stage output and generates the position, velocity, and time information, is called the baseband stage.

In at least one embodiment, the incoming signals are correlated with a PN code that has been locally generated by the PN generator 110 at a particular code frequency. To generate a PN sequence at the particular code frequency, the PN generator 110 receives an oscillating signal that is provided by a code NCO 114. When the incoming signal is correlated by the correlator 108, the result of the correlation may be sent to a processor 116 in a control block 140, where the processor 116 processes the incoming signal to determine a code and carrier frequency offset. Alternatively, the correlated incoming signal may be sent to IF mixer 106 for down conversion to baseband and then sent to the processor 116. The processor 116 sends separate control signals to the code NCO 114 and the carrier NCO 112, where the control signals set the frequency of the oscillating signal produced by the code NCO 114 and the carrier NCO 112 to align the oscillating signals produced by the code NCO 114 and the carrier NCO 112 with the frequencies of the signals received from GNSS satellites. When the incoming signal is aligned with the PN code generated locally by the PN generator 110 and the oscillating signal produced by the carrier NCO 112 is aligned with the intermediate frequency signal received from the RF front end 104, data can be extracted from the received signal. The data extracted from the received signal can then be used to compute the position of one or more satellites, estimate corrections, and the like. The position and velocity of the GNSS receiving system 100 can be calculated when processing signals from four or more satellites.

The code NCO 114 and the carrier NCO 112 rates are defined by a step size, represented as an integer, which is periodically added to the NCO's internal counters. The NCO precision is limited by the number of bits allocated for the internal counters. Thus, the code NCO 114 and the carrier NCO 112 are only able to represent frequencies at specific quantized frequency rates. As such, the carrier frequency and code frequency of the signal transmitted by the GNSS satellite may be at a frequency between the possible quantized frequency rates produced by the code NCO 114 and the carrier NCO 112. Due to the difference between the possible quantized frequency rates produced by the code NCO 114 and the carrier NCO 112 as compared to the actual carrier and code frequency of the signal received from the GNSS satellite, phase errors can accumulate over time. Further, the actual carrier frequency and code frequency frequently change due to factors like the Doppler effect, differences between the system clocks on the receiver and the GNSS satellite, and the like. These different factors can affect the accuracy of position data calculated by the GNSS receiving system 100 over time.

In embodiments of the present disclosure, to correct errors that can arise due to differences between quantized frequency rates and actual frequency rates, the GNSS receiving system 100 includes both a code NCO enhancer 120 and a carrier NCO enhancer 118. Both the code NCO enhancer 120 and the carrier NCO enhancer 118 function similarly as both the code NCO enhancer 120 and the carrier NCO enhancer 118 have a limited number of allocated bits and receive a desired frequency rate as an input from the processor 116 in the form of a step size. In at least one implementation, using the desired frequency rate, an NCO enhancer selects the quantized frequency rate that produces the smaller accumulated quantization error as compared to selecting the quantized frequency rate that is closest to the desired frequency rate. By selecting the quantized frequency rate that produces the smaller accumulated quantization error, the accumulated quantization error is constrained to be less than half of a quantization step between two neighboring quantized frequency rates.

In a further implementation, the processor 116 recalculates the desired NCO rates for the code NCO and the carrier NCO according to a particular calculation rate. Also, the processor 116 communicates with the NCO at a particular communication rate, where the communication rate is faster than the calculation rate. In certain implementations, when the processor 116 communicates with an NCO enhancer, the processor 116 sends the most recently calculated desired NCO rate as compared to sending the most recently calculated desired NCO rate only when the desired NCO rate is calculated. By sending the most recently calculated desired NCO rate at the communication rate, the NCO enhancer selects a quantized NCO rate that produces the smaller accumulated quantization error more frequently. By selecting the quantized NCO rate that produces the smaller accumulated quantization error more frequently, the average quantized NCO rate more closely approximates the desired NCO rate. For example, the processor may recalculate the desired frequencies for the code frequency and the carrier frequency at a rate of 50 Hz but instruct both of the code NCO enhancer 120 and the carrier NCO enhancer 118 to calculate a new quantized frequency rate at a rate of 1000 Hz. Thus, because the code NCO enhancer 120 and the carrier NCO enhancer 118 recalculate the quantized frequency rate at an increased rate and select the quantized frequency rate that produces the smaller accumulated quantization error, the average frequencies more accurately represents the actual frequencies of the received signals.

Figure 2:
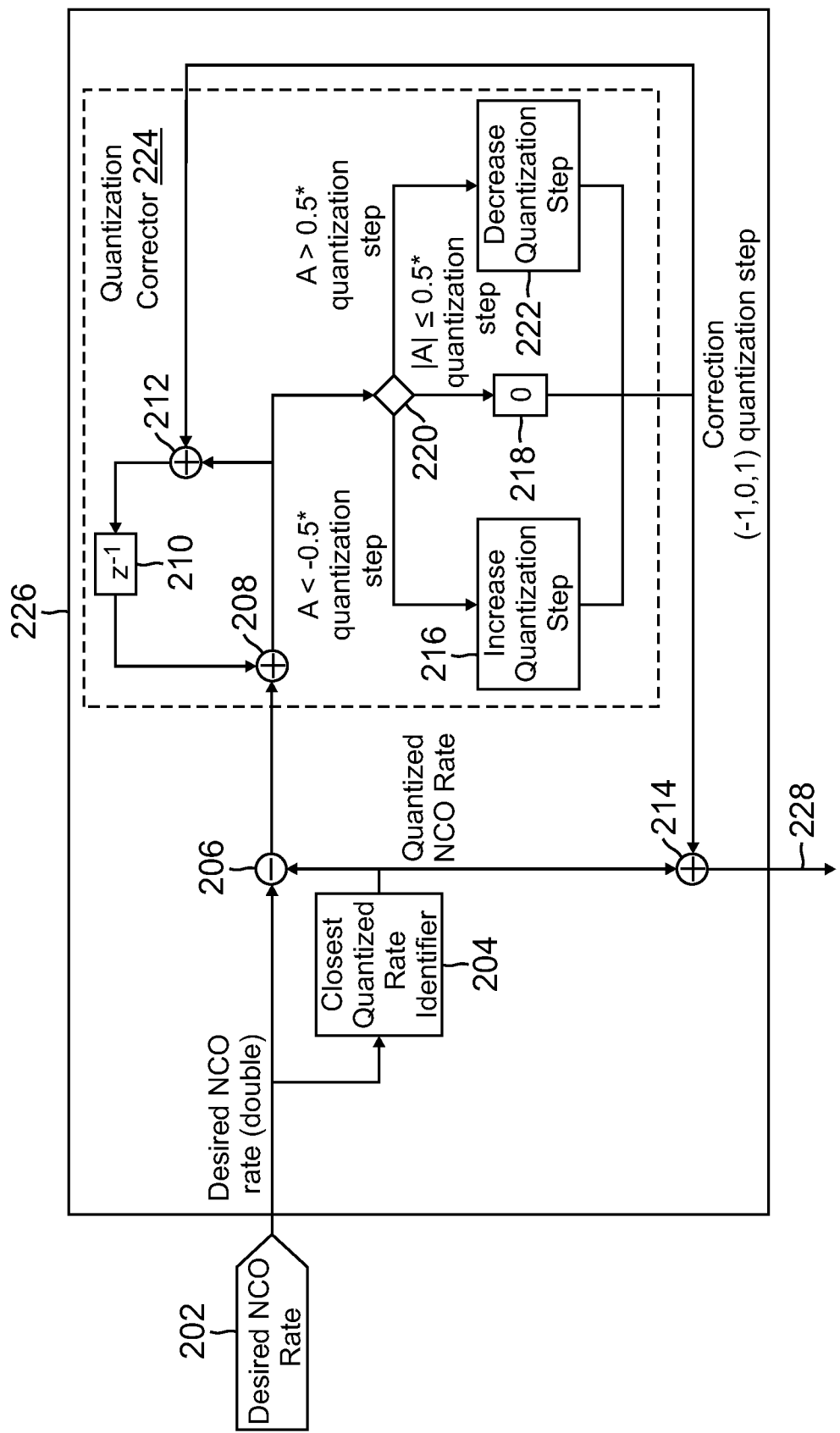
FIG. 2 is a block diagram of an NCO enhancer in one embodiment described in the present disclosure.

FIG. 2 is a block diagram of an NCO enhancer 226 according to one embodiment. As discussed above, an NCO enhancer 226 receives a desired NCO rate 202 from a processor, such as processor 116 in FIG. 1. In one implementation, the desired NCO rate 202 is received by the NCO enhancer 226 as a double, float, or other numeric value having a greater precision than an NCO controlled by the processor and enhanced by the NCO enhancer 226. When the NCO enhancer 226 receives the desired NCO rate 202, the NCO enhancer identifies the closest NCO rate to the desired NCO rate at closest quantized rate identifier 204. In certain implementations, the closest quantized NCO rate to the desired NCO rate may be provided to an NCO. However, when the closest quantized NCO rate differs from the desired NCO rate, the difference between the quantized and desired NCO rate accumulates over time as a phase error in either the code frequency or the carrier frequency. The NCO enhancer 226 functions to reduce the accumulated error that occurs due to the difference between the closest quantized NCO rate identified by the closest quantized rate identifier 204 and the desired NCO rate 202.

To reduce the accumulated error, the NCO enhancer 226 receives the quantized NCO rate calculated by the closest quantized rate identifier 204 at a differencer 206. The differencer 206 identifies the difference or quantization error between the closest quantized NCO rate and the desired NCO rate 202. The differencer 206 then provides a signal describing the quantization error to a summer 208. The summer 208 adds the quantization error to the previously accumulated quantization error to form an accumulated quantization error. The NCO enhancer 226 then passes the accumulated quantization error to a quantization corrector 224. The quantization corrector determines, at 220, the quantization rate that will produce the smaller accumulated quantization error. For example, if the absolute value of the accumulated quantization error is greater than half of a quantization step, the quantization corrector will select a correction that will shift the selected quantized NCO rate either up or down a single quantization level. When the accumulated quantization error is less than a negative half quantization step, the quantization corrector 224 determines that the quantization step should be increased at 216. Contrarily, when the accumulated quantization error is greater than a half quantization step, the quantization corrector 224 determines that the quantization step should be decreased at 222. If the accumulated quantization error is less than or equal to the absolute value of a half quantization step, the quantization corrector 224 determines that the closest quantized rate 204 produces the smaller accumulated quantization error.

When the quantization corrector 224 determines a quantization correction that produces a smaller accumulated quantization error, the NCO enhancer 226 applies the quantization correction to the quantized NCO rate at summer 214. For example, when the accumulated quantization error is greater than a positive half quantization step, the summing of the quantization correction with the quantized NCO rate shifts the quantized NCO rate down by one quantization step. Conversely, when the accumulated quantization error is less than a negative half quantization step, the summing of the quantization correction with the quantized NCO rate shifts the quantized NCO rate up by one quantization step. Further, the NCO enhancer 226 also adds the quantization correction to the accumulated quantization error at summer 212 to update the accumulated quantization error, wherein the updated accumulated quantization error is delayed at 210 for addition to subsequent calculated phase differences. When the quantized NCO rate has been corrected by the quantization correction, the NCO enhancer 226 provides the corrected quantized NCO rate as an output to either the code NCO or the carrier NCO through a rate output 228.

As described above, the NCO enhancer 226 may be implemented through any of several means that are available. For example, elements of the NCO enhancer 226 can be realized through discrete electronics, digital computer systems, digital signal processors, microprocessors, programmable controllers and field programmable gate arrays (FPGAs) or application-specific integrated circuits (ASICs). Therefore, other embodiments of the present invention may be program instructions resident on non-transient computer readable storage media which when implemented by such means enable them to implement embodiments of the present invention. Computer readable storage media are any form of a physical non-transitory computer memory storage device. Examples of such a physical computer memory device include, but is not limited to, punch cards, magnetic disks or tapes, optical data storage system, flash read only memory (ROM), non-volatile ROM, programmable ROM (PROM), erasable-programmable ROM (E-PROM), random access memory (RAM), or any other non-transitory form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

In certain implementations, the NCO enhancer 226 defines a current accumulated quantization error at a particular time k as the following:

$$A(k)=E(k)+A(k-1),$$

where $A(k)$ is the accumulated quantization error at time k and $E(k)$ is the instant quantization error at the time k. Furthermore, the instant quantization error at time k is equal to the following:

$$E(k)=Q(k)-R,$$

where $Q(k)$ is applied quantized NCO rate in time k and R is the desired NCO rate. At each epoch, which is based on the communication rate as dictated by the processor, the applied quantized NCO rate is applied such that it minimizes the accumulated quantization error $A(k)$. For example, $Q(k)$ is chosen such that it minimizes $E(k)+A(k-1)$. When the NCO enhancer 226 corrects the accumulated error as described above, the accumulated error is limited such that it is unable to exceed half of the quantization step.

Figure 3:
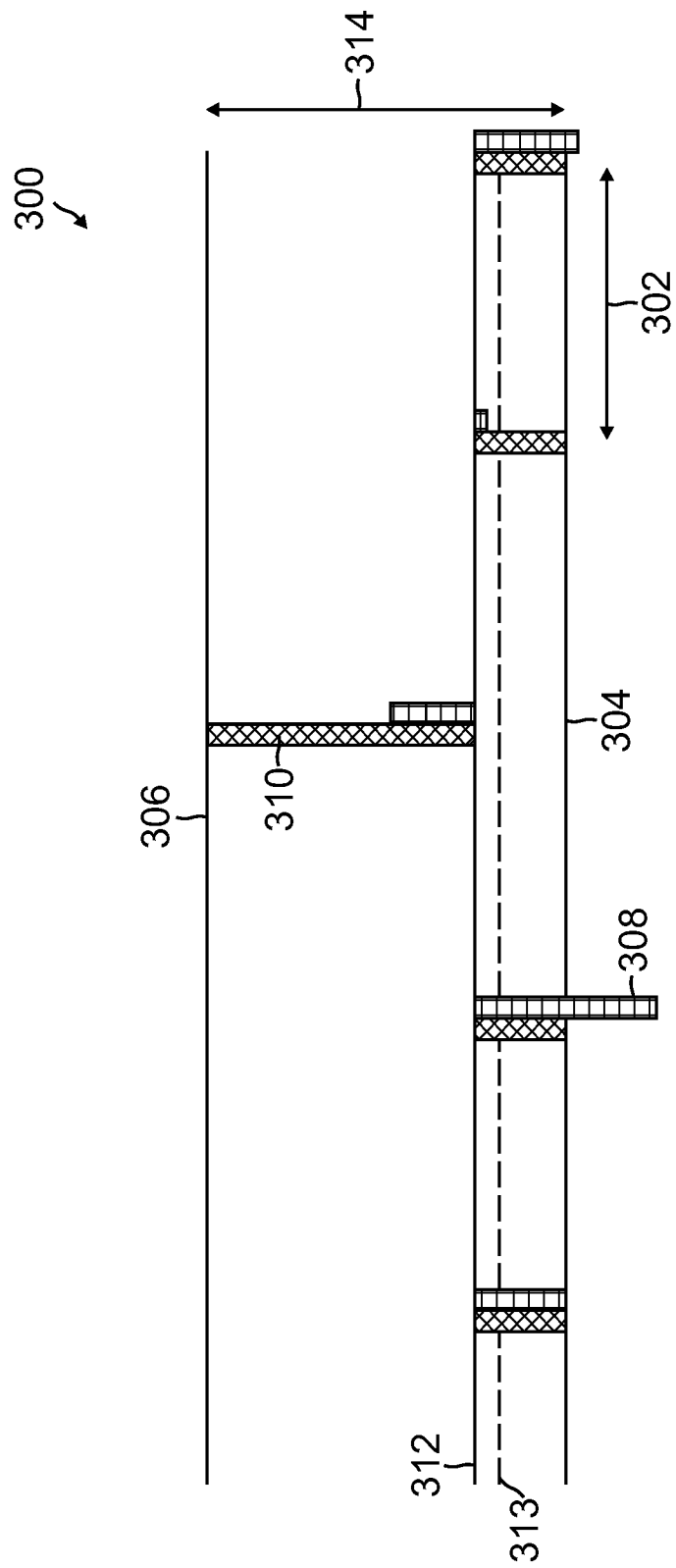
FIG. 3 is a timeline illustrating the effect of applying a quantized NCO rate that is selected based on the accumulated quantization error in one embodiment described in the present disclosure.

For example, FIG. 3 is a diagram of a timeline 300, where the timeline 300 illustrates the effect of applying a quantized NCO rate that produces the smaller accumulated quantization error. As illustrated, along the timeline 300, an NCO update is applied according to a communication rate 302. As described above in relation to FIG. 1, a processor periodically calculates an NCO rate update according to a calculation rate and transmits the most recently calculated NCO rate update to the NCO enhancer according to the communication rate 302. In certain implementations, the communication rate is faster than the calculation rate. Thus, in embodiments where the communication rate is faster than the calculation rate, the processor can transmit the most recently calculated NCO rate update to the NCO enhancer at the communication rate. The communication of the NCO rate update at the faster speed causes the NCO enhancer to calculate the quantized NCO rate that produces the smaller accumulated quantization error more frequently. The more frequent determination of the quantized NCO rate that produces the smaller accumulated quantization error allows the NCOs to more accurately approximate the desired NCO rate.

In at least one exemplary implementation, as shown in FIG. 3, the NCO enhancer sends a quantized NCO rate to a respective NCO at particular time that is defined by the communication rate 302. The NCO enhancer selects one of two possible quantized NCO rates that are separated by a quantization step 314, where a desired NCO rate 312 is between the two possible quantized NCO rates. For example, the desired NCO rate 312, as received from a control processor, is between an upper quantized NCO rate 306 and a lower quantized NCO rate 304. As the NCO is unable to provide the desired NCO rate 312 due to limited resolution caused by reasons stated above, the NCO enhancer selects one of the upper quantized NCO rate 306 and the lower quantized NCO rate 304.

When the NCO enhancer selects one of the quantized NCO rates, the NCO enhancer adds the quantization error 310 to an accumulated quantization error 308, where the quantization error 310 represents the difference between the selected quantized NCO rate and the desired NCO rate. When the NCO enhancer selects one of the quantized NCO rates, the NCO enhancer determines which of the upper quantized NCO rate 306 and the lower quantized NCO rate 304 will cause a smaller accumulated quantization error 308. For example, if the desired NCO rate 312 is closer to the lower quantized NCO rate 304, the NCO enhancer will initially select the lower quantized NCO rate 304, however the quantization error 310, due to the difference between the desired NCO rate 312 and the lower quantized NCO rate 304, accumulates over time and becomes progressively larger. To offset the accumulation of quantization errors that cause the accumulated quantization error 308 to increase, the NCO enhancer will occasionally select the upper quantized NCO rate 306 when the addition of the quantization error 310 due to the upper quantized NCO rate 306 to the accumulated quantization error 308 causes the magnitude of the accumulated quantization error 308 to be smaller than the magnitude of the accumulated quantization error 308 would have been had the lower quantized NCO rate 304 been selected. Further, by minimizing the accumulated quantization error 308 when a quantization NCO rate is selected, the average NCO rate 313 becomes closer to the desired NCO rate 312. Also, with a quicker communication rate 302, the average NCO rate 313 is also more able to approximate the desired NCO rate 312.

Figure 4:
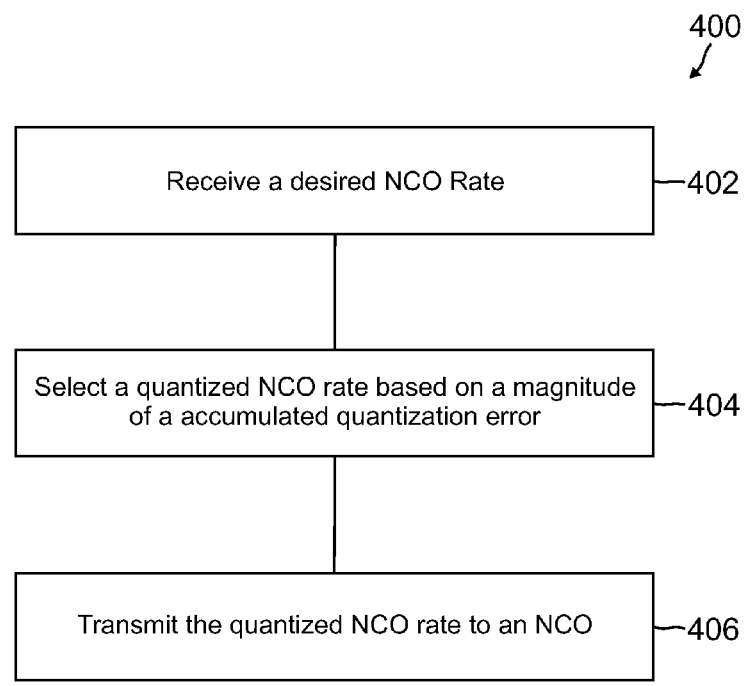
FIG. 4 is a flow diagram of a method for enhancing the NCO rate in one embodiment described in the present disclosure.

FIG. 4 is a flow diagram of a method 400 for enhancing an NCO rate. In certain embodiments, method 400 proceeds at 402, where a desired NCO rate is received. For example, an NCO enhancer receives a desired NCO rate from a controlling processor. Also, method 400 proceeds at 404, where a quantized NCO rate is selected based on a magnitude of an accumulated quantization error. In at least one exemplary implementation, the NCO enhancer monitors the accumulated quantization error that arises due to differences between the desired NCO rate and a quantized NCO rate. When the accumulated quantization error becomes greater than half a quantization step, the NCO enhancer calculates a quantization step correction that shifts the quantized NCO rate that is closest to the desired NCO rate by one quantization step in the opposite direction of the uncorrected accumulated quantization error. Further, method 400 proceeds at 406 where the quantized NCO rate is transmitted to an NCO. In certain embodiments, the NCO enhancer is one of two NCO enhancers in a GNSS receiver, where one of the NCO enhancers provides a quantized NCO rate to a code NCO and the other NCO enhancer provides a quantized NCO rate to a carrier NCO. The code NCO provides an oscillating signal that is used to remove a code from a code modulated signal and the carrier NCO provides an oscillating signal that is used to mix an intermediate frequency signal down to baseband. The processor that sends the desired NCO rate to the NCO enhancer also monitors the baseband signal to determine the desired NCO rate.

Example Embodiments

Example 1 includes a global navigation satellite system receiver, the receiver comprising: a front end configured to receive global navigation satellite system signals and mix the received global navigation satellite system signals to intermediate frequency signals; a code and carrier remover configured to mix the intermediate frequency signals to baseband signals and remove codes from the baseband signals; a code numerically controlled oscillator configured to provide a code oscillating signal to the code and carrier remover, wherein the code and carrier remover uses the code oscillating signal to remove codes from the baseband signal; a carrier numerically controlled oscillator configured to provide a carrier oscillating signal to the code and carrier remover, wherein the code and carrier remover uses the carrier oscillating signal to mix the intermediate frequency signals to the baseband signals; a control block, wherein the control block monitors the baseband signal to determine a desired code numerically controlled oscillator rate and a desired carrier numerically controlled oscillator rate; a code numerically controlled oscillator enhancer configured to receive the desired code numerically controlled oscillator rate from the control block, wherein the code numerically controlled oscillator enhancer selects a quantized code oscillator rate for the code numerically controlled oscillator based on an accumulated quantization error; and a carrier numerically controlled oscillator enhancer configured to receive the desired carrier numerically controlled oscillator rate from the control block, wherein the carrier numerically controlled oscillator enhancer selects a quantized carrier oscillator rate for the carrier numerically controlled oscillator based on the carrier accumulated quantization error.

Example 2 includes the global navigation satellite system receiver of Example 1, wherein the code numerically controlled oscillator enhancer and the carrier numerically controlled oscillator enhancer are implemented in an FPGA.

Example 3 includes the global navigation satellite system receiver of any of Examples 1-2, wherein the control block calculates the desired code numerically controlled oscillator rate and the desired carrier numerically controlled oscillator rate at a calculation rate.

Example 4 includes the global navigation satellite system receiver of Example 3, wherein the control block transmits the desired code numerically controlled oscillator rate and the desired carrier numerically controlled oscillator rate at a communication rate and the code numerically controlled oscillator enhancer determines a new quantized carrier oscillator rate and the carrier numerically controlled oscillator enhancer determines a new quantized carrier oscillator rate at the communication rate.

Example 5 includes the global navigation satellite system receiver of Example 4, wherein the communication rate is faster than the calculation rate.

Example 6 includes the global navigation satellite system receiver of any of Examples 1-5, wherein the code numerically controlled oscillator enhancer and the carrier numerically controlled oscillator enhancer function as a numerically controlled oscillator enhancer, wherein the numerically controlled oscillator enhancer: identifies a closest quantized numerically controlled oscillator rate to a desired numerically controlled oscillator rate; calculates a rate difference between the closest quantized numerically controlled oscillator rate and the desired numerically controlled oscillator rate; updates an accumulated quantization error by adding the rate difference to the accumulated quantization error; determines a quantization correction based on the accumulated quantization error; and applies the quantization correction to the closest quantized numerically controlled oscillator rate.

Example 7 includes the global navigation satellite system receiver of Example 6, wherein the numerically controlled oscillator enhancer: decreases the quantized numerically controlled oscillator rate by a quantization step, when the accumulated quantization error is greater than half of the quantization step; increases the quantized numerically controlled oscillator rate by a quantization step, when the accumulated quantization error is less than half of a negative quantization step; and identifies no quantization correction when the magnitude of the accumulated quantization error is less than half of the quantization step.

Example 8 includes a method for enhancing numerically controlled oscillators, the method comprising: receiving a desired numerically controlled oscillator rate; selecting a quantized numerically controlled oscillator rate from two neighboring quantized numerically controlled oscillator rates that are closest to the desired numerically controlled oscillator rate based on a magnitude of an accumulated quantization error; and transmitting the quantized numerically controlled oscillator rate to a numerically controlled oscillator.

Example 9 includes the method of Example 8, wherein the desired numerically controlled oscillator rate is received at a communication rate.

Example 10 includes the method of Example 9, wherein the quantized numerically controlled oscillator rate is determined according to the communication rate.

Example 11 includes the method of any of Examples 8-10, wherein selecting the quantized numerically controlled oscillator rate comprises: identifying a closest quantized numerically controlled oscillator rate to the desired numerically controlled oscillator rate; calculating a rate difference between the closest quantized numerically controlled oscillator rate and the desired numerically controlled oscillator rate; updating the accumulated quantization error by adding the rate difference to the accumulated quantization error; determining a quantization correction based on the accumulated quantization error; and applying the quantization correction to the closest quantized numerically controlled oscillator rate.

Example 12 includes the method of Example 11, wherein determining the quantization correction comprises at least one of: decreasing the quantized numerically controlled oscillator rate by a quantization step, when the updated accumulated quantization error is greater than half of the quantization step; increasing the quantized numerically controlled oscillator rate by a quantization step, when the updated accumulated quantization error is less than half of a negative quantization step; and identifying no quantization correction when the magnitude of the updated accumulated quantization error is less than half of the quantization step.

Example 13 includes the method of any of Examples 8-12, wherein the numerically controlled oscillator enhancer provides quantized numerically controlled oscillator rate to at least one of: a code numerically controlled oscillator in a global navigation satellite system receiver; and a carrier numerically controlled oscillator in the global navigation satellite system receiver.

Example 14 includes the method of Example 13, wherein a processor determines a desired code numerically controlled oscillator rate for the code numerically controlled oscillator and the processor determines a desired carrier numerically controlled oscillator rate for the carrier numerically controlled oscillator.

Example 15 includes the method of Example 14, further comprising determining the desired code numerically controlled oscillator rate and the desired carrier numerically controlled oscillator rate based on a baseband signal, wherein the baseband signal has been down converted from a radio frequency and despreaded.

Example 16 includes a numerically controlled oscillator enhancer, the enhancer comprising: a desired rate interface configured to receive a desired numerically controlled oscillator rate from an external device; a closest quantized rate identifier configured to identify a closest quantization rate that is closest to the desired numerically controlled oscillator rate; a quantization rate corrector configured to identify the quantization rate correction that, when applied to the closest quantization rate, constrains an accumulated quantization error within an error range; and a rate output configured to output a corrected quantized numerically controlled oscillator rate.

Example 17 includes the enhancer of Example 16, wherein the quantization rate corrector identifies the quantization rate correction by: calculating a rate difference between the closest quantization rate and the desired numerically controlled oscillator rate; updating the accumulated quantization error by adding the rate difference to the accumulated quantization error; determining a quantization correction based on the updated accumulated quantization error; and applying the quantization correction to the closest quantized numerically controlled oscillator rate.

Example 18 includes the enhancer of any of Examples 16-17, wherein the quantization rate corrector identifies the quantization rate correction to be at least one of: a decrement in the quantized numerically controlled oscillator rate by a quantization step, when the updated accumulated quantization error is greater than half of the quantization step; an increment in the quantized numerically controlled oscillator rate by a quantization step, when the updated accumulated quantization error is less than half of a negative quantization step; and an indication that the closest quantized rate results in an accumulated quantization error is within the error range.

Example 19 includes the enhancer of any of Examples 16-18, wherein the desired rate interface receives the desired numerically controlled oscillator rate at a communication rate, wherein the rate output outputs a corrected quantized numerically controlled oscillator rate at the communication rate.

Example 20 includes the enhancer of any of Examples 16-19, wherein the rate output provides the corrected quantized numerically controlled oscillator rate to at least one of: a code numerically controlled oscillator in a global navigation satellite system; and a carrier numerically controlled oscillator in a global navigation satellite system.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A global navigation satellite system receiver, the receiver comprising:

a front end configured to receive global navigation satellite system signals and mix the received global navigation satellite system signals to intermediate frequency signals;

a code and carrier remover configured to mix the intermediate frequency signals to baseband signals and remove codes from the baseband signals;

a code numerically controlled oscillator configured to provide a code oscillating signal to the code and carrier remover, wherein the code and carrier remover uses the code oscillating signal to remove codes from the baseband signal;

a carrier numerically controlled oscillator configured to provide a carrier oscillating signal to the code and carrier remover, wherein the code and carrier remover uses the carrier oscillating signal to mix the intermediate frequency signals to the baseband signals;

a control block, wherein the control block monitors the baseband signal to determine a desired code numerically controlled oscillator rate and a desired carrier numerically controlled oscillator rate;

a code numerically controlled oscillator enhancer configured to receive the desired code numerically controlled oscillator rate from the control block, wherein the code numerically controlled oscillator enhancer selects a quantized code oscillator rate for the code numerically controlled oscillator based on an accumulated quantization error; and a carrier numerically controlled oscillator enhancer configured to receive the desired carrier numerically controlled oscillator rate from the control block, wherein the carrier numerically controlled oscillator enhancer selects a quantized carrier oscillator rate for the carrier numerically controlled oscillator based on the carrier accumulated quantization error.

2. The global navigation satellite system receiver of claim 1, wherein the code numerically controlled oscillator enhancer and the carrier numerically controlled oscillator enhancer are implemented in Field Programmable Gate Array (FPGA).

3. The global navigation satellite system receiver of claim 1, wherein the control block calculates the desired code numerically controlled oscillator rate and the desired carrier numerically controlled oscillator rate at a calculation rate.

4. The global navigation satellite system receiver of claim 3, wherein the control block transmits the desired code numerically controlled oscillator rate and the desired carrier numerically controlled oscillator rate at a communication rate and the code numerically controlled oscillator enhancer determines a new quantized code oscillator rate and the carrier numerically controlled oscillator enhancer determines a new quantized carrier oscillator rate at the communication rate.

5. The global navigation satellite system receiver of claim 4, wherein the communication rate is faster than the calculation rate.

6. The global navigation satellite system receiver of claim 1, wherein the code numerically controlled oscillator enhancer and the carrier numerically controlled oscillator enhancer function as a numerically controlled oscillator enhancer, wherein the numerically controlled oscillator enhancer:

identifies a closest quantized numerically controlled oscillator rate to a desired numerically controlled oscillator rate;

calculates a rate difference between the closest quantized numerically controlled oscillator rate and the desired numerically controlled oscillator rate;

updates an accumulated quantization error by adding the rate difference to the accumulated quantization error;

determines a quantization correction based on the accumulated quantization error; and applies the quantization correction to the closest quantized numerically controlled oscillator rate.

7. The global navigation satellite system receiver of claim 6, wherein the numerically controlled oscillator enhancer:

decreases the quantized numerically controlled oscillator rate by a quantization step, when the accumulated quantization error is greater than half of the quantization step;

increases the quantized numerically controlled oscillator rate by the quantization step, when the accumulated quantization error is less than half of a negative quantization step; and identifies no quantization correction when the magnitude of the accumulated quantization error is less than half of the quantization step.

8. A method for enhancing numerically controlled oscillators, the method comprising:

receiving a desired numerically controlled oscillator rate;

selecting a quantized numerically controlled oscillator rate from two neighboring quantized numerically controlled oscillator rates that are closest to the desired numerically controlled oscillator rate based on a magnitude of an accumulated quantization error; and transmitting the quantized numerically controlled oscillator rate to a numerically controlled oscillator.

9. The method of claim 8, wherein the desired numerically controlled oscillator rate is received at a communication rate.

10. The method of claim 9, wherein the quantized numerically controlled oscillator rate is determined according to the communication rate.

11. The method of claim 8, wherein selecting the quantized numerically controlled oscillator rate comprises:

identifying a closest quantized numerically controlled oscillator rate to the desired numerically controlled oscillator rate;

calculating a rate difference between the closest quantized numerically controlled oscillator rate and the desired numerically controlled oscillator rate;

updating the accumulated quantization error by adding the rate difference to the accumulated quantization error;

determining a quantization correction based on the accumulated quantization error; and applying the quantization correction to the closest quantized numerically controlled oscillator rate.

12. The method of claim 11, wherein determining the quantization correction comprises at least one of:

decreasing the quantized numerically controlled oscillator rate by the quantization step, when the updated accumulated quantization error is greater than half of the quantization step;

increasing the quantized numerically controlled oscillator rate by a quantization step, when the updated accumulated quantization error is less than half of a negative quantization step; and identifying no quantization correction when the magnitude of the updated accumulated quantization error is less than half of the quantization step.

13. The method of claim 8, wherein the numerically controlled oscillator enhancer provides quantized numerically controlled oscillator rate to at least one of:

a code numerically controlled oscillator in a global navigation satellite system receiver; and a carrier numerically controlled oscillator in the global navigation satellite system receiver.

14. The method of claim 13, wherein a processor determines a desired code numerically controlled oscillator rate for the code numerically controlled oscillator and the processor determines a desired carrier numerically controlled oscillator rate for the carrier numerically controlled oscillator.

15. The method of claim 14, further comprising determining the desired code numerically controlled oscillator rate and the desired carrier numerically controlled oscillator rate based on a baseband signal, wherein the baseband signal has been down converted from a radio frequency and despreaded.

16. A numerically controlled oscillator enhancer, the enhancer comprising:

a desired rate interface configured to receive a desired numerically controlled oscillator rate from an external device;

a closest quantized rate identifier configured to identify a closest quantization rate that is closest to the desired numerically controlled oscillator rate;

a quantization rate corrector configured to identify the quantization rate correction that, when applied to the closest quantization rate, constrains an accumulated quantization error within an error range; and a rate output configured to output a corrected quantized numerically controlled oscillator rate.

17. The enhancer of claim 16, wherein the quantization rate corrector identifies the quantization rate correction by:

calculating a rate difference between the closest quantization rate and the desired numerically controlled oscillator rate;

updating the accumulated quantization error by adding the rate difference to the accumulated quantization error;

determining a quantization correction based on the updated accumulated quantization error; and applying the quantization correction to the closest quantized numerically controlled oscillator rate.

18. The enhancer of claim 16, wherein the quantization rate corrector identifies the quantization rate correction to be at least one of:

a decrement in the quantized numerically controlled oscillator rate by the quantization step, when the updated accumulated quantization error is greater than half of the quantization step;

an increment in the quantized numerically controlled oscillator rate by a quantization step, when the updated accumulated quantization error is less than half of a negative quantization step; and an indication that the closest quantized rate results in an accumulated quantization error is within the error range.

19. The enhancer of claim 16, wherein the desired rate interface receives the desired numerically controlled oscillator rate at a communication rate, wherein the rate output outputs a corrected quantized numerically controlled oscillator rate at the communication rate.

20. The enhancer of claim 16, wherein the rate output provides the corrected quantized numerically controlled oscillator rate to at least one of:

a code numerically controlled oscillator in a global navigation satellite system; and a carrier numerically controlled oscillator in the gloabal navigation satellite system.

\* \* \* \* \*